United States Patent
Goe et al.

(10) Patent No.: US 8,817,909 B2
(45) Date of Patent: Aug. 26, 2014

(54) POLAR MODULATOR ARRANGEMENT, POLAR MODULATION METHOD, FILTER ARRANGEMENT AND FILTERING METHOD

(75) Inventors: Chitao Goe, Tampere (FI); Markku Renfors, Tampere (FI)

(73) Assignee: Intel Mobile Communications GmbH, Neubiberg (DE)

( * ) Notice: Subject to any disclaimer, the term of this patent is extended or adjusted under 35 U.S.C. 154(b) by 1658 days.

(21) Appl. No.: 11/606,214

(22) Filed: Nov. 29, 2006

(65) Prior Publication Data

US 2008/0123774 A1 May 29, 2008

(51) Int. Cl.
*H03C 1/00* (2006.01)
*H03C 5/00* (2006.01)

(52) U.S. Cl.
CPC ........................................ *H03C 5/00* (2013.01)
USPC ........... 375/297; 375/296; 375/295; 375/298; 375/302; 375/308

(58) Field of Classification Search
CPC ...................................................... H04B 10/532
USPC .......................... 375/297, 296, 295, 302, 308
See application file for complete search history.

(56) References Cited

U.S. PATENT DOCUMENTS

| | | | | |
|---|---|---|---|---|
| 5,285,165 A | * | 2/1994 | Renfors et al. | 327/552 |
| 5,451,919 A | * | 9/1995 | Chu et al. | 338/22 R |
| 5,491,725 A | * | 2/1996 | White | 375/324 |
| 6,477,404 B1 | * | 11/2002 | Yonce et al. | 600/510 |
| 7,243,037 B2 | * | 7/2007 | Tracht et al. | 702/106 |
| 2002/0041203 A1 | * | 4/2002 | Pina et al. | 329/349 |
| 2003/0002693 A1 | * | 1/2003 | Aylward et al. | 381/98 |
| 2004/0125113 A1 | * | 7/2004 | Kempf et al. | 345/611 |
| 2004/0233886 A1 | * | 11/2004 | Dieterich et al. | 370/348 |
| 2006/0250891 A1 | * | 11/2006 | Krohn | 367/38 |

* cited by examiner

Primary Examiner — Michael Neff
(74) Attorney, Agent, or Firm — Eschweiler & Associates, LLC

(57) ABSTRACT

A polar modulator arrangement includes a first and a second node to receive a signal having a first and a second component corresponding to an amplitude component and a phase component. A frequency separation device separates the first component into a low-frequency portion and a high-frequency portion depending on a cut-off frequency. The high-frequency portion is nonlinearly filtered and combined with the low-frequency portion to a first processed component. A combination element generates a polar modulated radio frequency signal as a function of the first processed component and the second component.

34 Claims, 7 Drawing Sheets

POLAR MODULATOR ARRANGEMENT, POLAR MODULATION METHOD, FILTER ARRANGEMENT AND FILTERING METHOD

FIELD OF THE INVENTION

The invention is directed to the field of communications, and more particularly is directed to a polar modulator and associated polar modulation method.

BACKGROUND OF THE INVENTION

The requirements for the signal quality of modulators, for example in transmitting devices, become more stringent as need for high data rates and increasing mobility grows. In modern mobile radio standards, such as Universal Mobile Telecommunications System (UMTS), Wideband Code Division Multiple Access (WCDMA), Global System for Mobile Communication (GSM), Enhanced Data Rates for GSM Evolution (EDGE), Bluetooth Medium Data Rate, or Wireless Local Area Network (WLAN) according to 802.11a/b/g require special modulation types for data transmission which modulate both the phase and the amplitude of a carrier signal at the same time.

Simultaneous amplitude and phase modulation make it possible to achieve higher data transmission rates and thus better bandwidth efficiency. The mobile radio standards mentioned above envisage, for example, the use of quadrature phase shift keying (QPSK), 8-phase shift keying (8-PSK) or quadrature amplitude modulation (QAM) as modulation types for data transmission.

Depending on the selected application for the individual mobile radio standards, these high-quality modulation types are used not only for data transmission from a base station to a mobile communication appliance but also from the mobile communication appliance to the base station. The modulation types which are used for modern mobile radio standards are particularly sensitive to possible interference or distortion which is produced by various components in a transmission path. Additionally, the much more sophisticated multi-band operation and modulation formats in advanced wireless communication systems specify highly strict and difficult requirements for out-of-band emissions and spurious emissions. For example, in UMTS systems, it can be necessary to provide a radio frequency filter like a surface acoustic wave (SAW) filtering device before or after the final power amplifier in a transmission path to meet given requirements. Such radio frequency filters use a certain amount of area on a printed circuit board (PCB) and therefore increase the cost of a transmitter device.

A modulation can be performed using a vector modulation in which data to be transmitted is provided with an in-phase component and a quadrature component which form a complex signal. In other systems, also a polar modulator can be used in which the data are coded as polar coordinates with an amplitude component and a phase component. The amplitude component is usually digital-to-analog converted and used for an amplitude modulation of a carrier signal which comprises the phase information of the phase component. A bandwidth of amplitude and phase components is usually expanded compared to the bandwidth of in-phase and quadrature components of a vector modulation.

With the use of a polar modulator or a polar transmitter, some of the radio frequency filtering efforts can be reduced. Nevertheless, there can be a need to implement a radio frequency filter also for conventional polar modulators to fulfill the out-of-band and spurious emission requirements specified by advanced mobile radio standards.

BRIEF DESCRIPTION OF THE DRAWINGS

The invention is explained in detail below using exemplary embodiments with reference to the drawings in which.

DETAILED DESCRIPTION OF THE INVENTION

Figure 1:
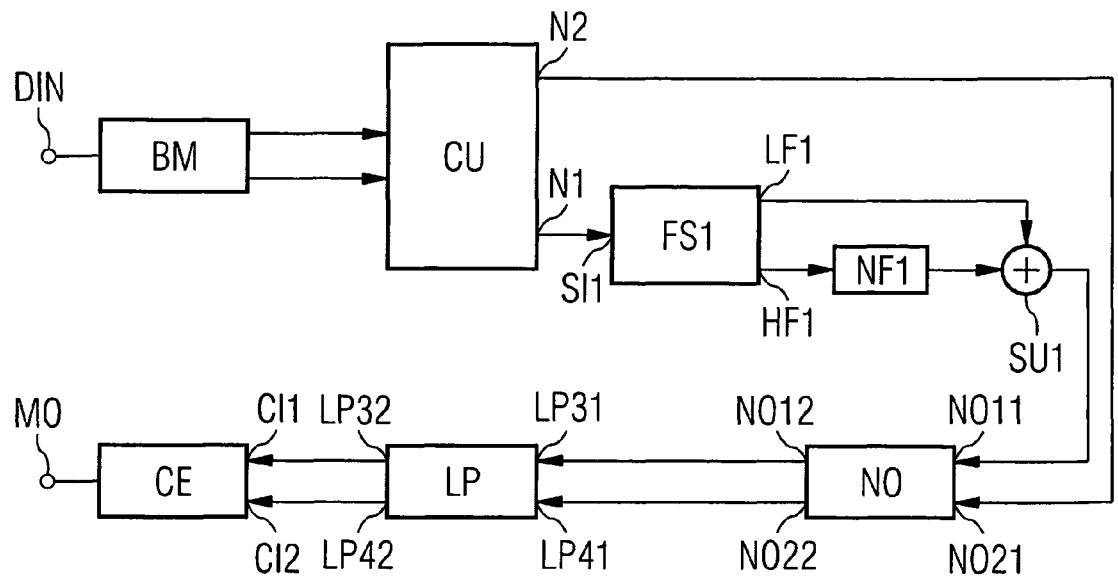
FIG. 1 is a first exemplary embodiment of a polar modulator arrangement.

In the following description further aspects and embodiments of the present invention are disclosed. In addition, reference is made to the accompanying drawings, which form a part hereof, and in which is shown by way of illustration, in which the invention may be practiced. The embodiments of the drawings present a discussion in order to provide a better understanding of one or more aspects of the present invention. This disclosure is not intended to limit the features or key-elements of the invention to a specific embodiment. Rather, the different elements, aspects and features disclosed in the embodiments can be combined in different ways by a person skilled in the art to achieve one or more advantages of the present invention. It is to be understood that other embodiments may be utilized and structural or logical changes may be made without departing from the scope of the present invention. The elements of the drawing are not necessarily to scale relative to each other. Like reference numerals designate corresponding similar parts.

FIG. 1 shows an exemplary embodiment of a polar modulator arrangement. It comprises a baseband modulation unit BM which on its input side is coupled to a data input DIN. A conversion unit CU is coupled to the baseband modulation unit BM and comprises a first and a second node N1, N2. A frequency separation device FS1 comprises an input SI1 which is coupled to the first node N1, a low-frequency output LF1 and a high-frequency output HF1. A summation element SU1 comprises two inputs which are coupled to the low-frequency output LF1 and to the high-frequency output HF1 via a nonlinear filter device NF1. A notch filter element NO comprises filter inputs NO11, NO21 which are coupled to an output of the summation element SU1 and to the second node N2. Filter outputs NO12, NO22 of the notch filter element NO are coupled to filter inputs LP31, LP41 of a low-pass filter element LP. A combination element CE comprises a first combination input CI1 which is coupled to an output LP32 of the low-pass filter element LP and a second combination input CI2 which is coupled to an output LP42 of the low-pass filter element LP. An output of the combination element CE forms a modulator output MO.

Data to be transmitted in a transmission path or to be modulated, respectively, are received at the data input DIN. The baseband modulation unit BM performs a modulation of the input data and generates an in-phase component and a quadrature component which are provided to the conversion unit CU. In the conversion unit CU, an amplitude component and a phase component are generated from the in-phase component and the quadrature component. The conversion unit CU can, for example, comprise a coordinate rotation digital computer (CORDIC) to perform the conversion from the vector components to the polar components. In an alternative embodiment, the baseband modulation unit BM can be comprised by the conversion unit CU such that the conversion unit CU derives the amplitude component and the phase component as a function of the input data to be modulated which are provided at the data input DIN.

The conversion unit CU provides the amplitude component and the phase component as a first component at the first node N1 and a second component at the second node N2. The first component can be the phase component such that the second component is the amplitude component. In an alternative embodiment, the first component is the amplitude component and the second component is the phase component.

The frequency separation device FS1 receives the first component and separates it into a low-frequency portion which is provided at the low-frequency output LF1 and a high-frequency portion which is provided at the high-frequency output HF1. The frequency separation is performed depending on a predetermined cut-off frequency of the frequency separation device FS1.

The high-frequency portion of the first component is filtered nonlinearly with the nonlinear filter device NF1 and provided to the summation element SU1 where it is combined with the low-frequency portion of the first component.

The processed first component at the output of the summation element SU1 is provided to the notch filter input NO1. The unfiltered second component is provided to the second notch filter input NO21. In the notch filter element NO, an individual notch filtering of the first processed component and a second component is performed. In other words, a notch frequency or frequency range respectively for the first component can be different from a notch frequency or frequency range respectively for the second component.

The notch filtered first and second components are provided to a low-pass filter element LP. Similarly to the notch filter element NO, an individual low-pass filtering of the first and the second component is performed. A cut-off frequency for the first component can be different from a cut-off frequency for the second component.

The filtered first and second component or amplitude and phase component, respectively, are provided to the first and the second combination input CI1, CI2 of the combination element CE. The combination element CE generates a polar modulated radio frequency signal as a function of the first and the second component, for example by performing an amplitude modulation as a function of the amplitude component of a phase modulated carrier signal, wherein the phase modulation is a function of the phase component. The phase modulated radio frequency signal is provided at the modulator output MO.

In an alternative embodiment, the low-pass filter element LP and the notch filter element NO can be omitted such that the first and the second combination input CI1, CI2 are directly coupled to the output of the summation element SU1 and second node N2, respectively. In this case, the polar modulated radio frequency signal is generated as a function of the first component which is processed through the frequency separation device, the nonlinear filter device and the summation element, and the second component. In another embodiment, the low-pass filter element LP is arranged before the notch filter element NO in the signal pass.

It is also possible in another embodiment to only omit the low-pass-filter element LP or the notch filter element NO in the polar modulator arrangement. Furthermore, it is possible in another embodiment that only one of the first and the second component is filtered in the low-pass filter element LP or the notch filter element NO, respectively. In other words, it is possible that one component is forwarded without filtering in each case.

According to one embodiment of the invention, it is possible to reduce the spurious emission within the polar modulated radio frequency signal such that the signal quality fulfills the spectral requirements specified by a respective radio mobile standard. Therefore, a radio frequency filter like a SAW filter can be left out in the design of a polar transmitter. In this case, less space on a printed circuit board is needed which reduces production costs.

In addition, in accordance with one embodiment the data to be modulated as the amplitude component and the phase component can be processed as digital signals. In this embodiment, it is possible to perform the digital/analog conversion within the combination element CE when generating the polar modulated signal. It is also possible in one embodiment to perform a digital/analog conversion of the amplitude component and the phase component at another place within the polar modulator arrangement. One of the embodiments described or one of the methods used within may be implemented as software or in a digital signal processor (DSP) or a field programmable gate array (FPGA) or in an application specific integrated circuit (ASIC).

In one embodiment the shown polar modulator arrangement uses a filter arrangement comprising the frequency separation device FS1, the nonlinear filter device NF1, and the summation element SU1. The filter arrangement can further comprise a single notch filter corresponding to the notch filter element NO and a single low-pass filter corresponding to the low-pass filter element LP. In this case, the node N1 forms the filter input of the filter arrangement, for example.

Figure 2:
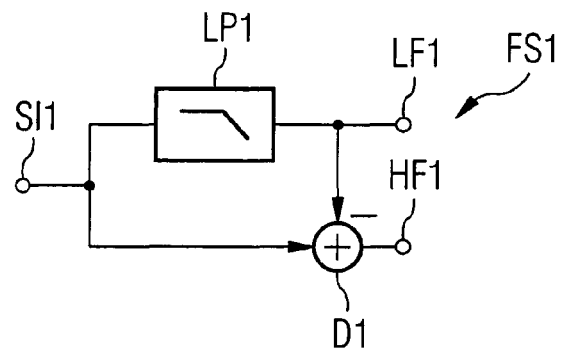
FIG. 2 is an exemplary embodiment of a frequency separation device.

FIG. 2 shows an exemplary embodiment of a frequency separation device FS1. It comprises a low-pass filter LP1 which is coupled between the signal input SI1 and the low-frequency output LF1. The frequency separation device FS1 further comprises a difference element D1 which with its positive input is coupled to the signal input SI1 and with its negative input is coupled to the low-frequency output LF1 or to an output of the low-pass filter LP1, respectively. An output of the difference element D1 is coupled to the high-frequency output HF1.

The low-pass filter LP1 comprises a cut-off frequency to generate the low-frequency portion of the first component provided at the signal input SI1. The high-frequency portion of the first component is generated by subtracting the low-frequency portion from the first component. In other words, a combination of the low-frequency portion and the high-frequency portion would result in the signal component provided at the input side. The cut-off frequency of the low-pass filter LP1 can be chosen according to spectral requirements of a mobile radio standard.

Figure 3:
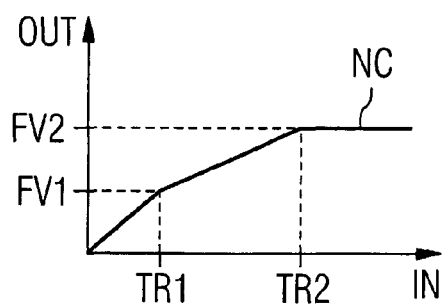
FIG. 3 is an exemplary diagram of an input/output characteristic of a nonlinear filter device.

FIG. 3 shows an exemplary diagram of an input/output characteristic of an embodiment of a nonlinear filter device NF1. The diagram shows a nonlinear characteristic NC of an output signal OUT as a function of an input signal IN of the nonlinear filter device NF1.

If an input value to the nonlinear filter device NF1 is less than a first threshold value TR1, the output value corresponds to the input value. For example, this results in a fixed output value FV1 for an input value being equal to the first threshold value TR1.

If an input value is greater than the first threshold value TR1 but less than the second threshold value TR2, an output value corresponds to a linearly scaled function of the input value. To this end, the input signal is scaled down by a predetermined scaling factor and provided with an offset such that an output value corresponds to the first fixed value FV1 for an input value corresponding to the first threshold value TR1.

For an input value corresponding to a second threshold value TR2, an output value results in a second fixed value FV2. If an input value is greater than the second threshold value TR2, the input signal is clipped such that the output value corresponds to the second fixed value FV2.

If the nonlinear characteristic NC is used within the nonlinear filter device NF1 of the embodiment of the polar modulator arrangement of FIG. 1, the high-frequency portion of the first component is provided to the nonlinear filter device NF1. In this case, the nonlinear filter device outputs the high-frequency portion, if an instantaneous value of the high-frequency portion is less than a first threshold value TR1. The high-frequency portion scaled as a function of a predetermined scaling factor is output if the instantaneous value of the high-frequency portion is greater than the first threshold value TR1 and less than a second threshold value TR2. The nonlinear filter device NF1 outputs the fixed value FV2, if the instantaneous value of the high-frequency portion is greater than the second threshold value TR2.

In one embodiment the nonlinear characteristic NC represents a continuous and monotonic function. A scaling and/or clipping of an input signal can be performed for negative input values accordingly, for example by providing corresponding negative threshold values and fixed values. In alternative embodiments, the nonlinear characteristic of the nonlinear filter device NF1 can comprise further threshold values, further fixed values and further scaling factors. It is also possible in one embodiment to provide the input/output function of the nonlinear filter device NF1 with a lookup table.

Figure 4:
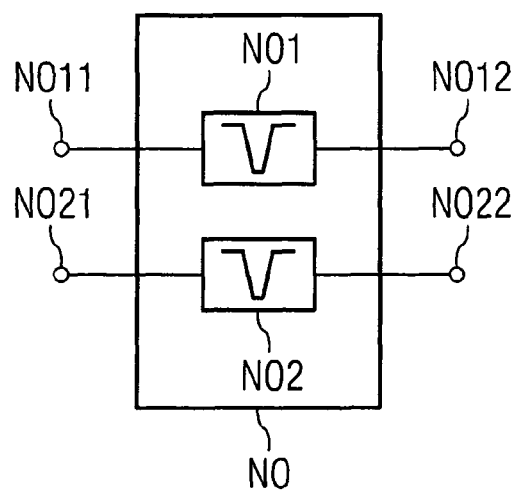
FIG. 4 is an exemplary embodiment of a notch filter element.

FIG. 4 shows an exemplary embodiment of a notch filter element NO. It comprises a first notch filter NO1 and a second notch filter NO2 which are coupled between a filter input NO11 and a filter output NO12 and between a filter input NO21 and a filter output NO22, respectively. The notch filters NO1, NO2 can have different frequency ranges for the first and the second component, respectively. In one embodiment each of the notch filters NO1, NO2 performs a band-stop filtering in a small frequency range. Furthermore, in one embodiment each of the notch filters NO1, NO2 can comprise several cascaded notch filters resulting in a transfer function of the respective notch filters NO1, NO2. The notch filter element NO can be implemented with digital or analog notch filters NO1, NO2.

Figure 5:
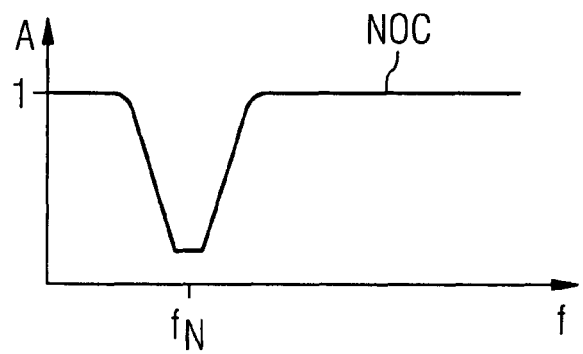
FIG. 5 is an exemplary characteristic of a notch filter.

FIG. 5 shows an exemplary frequency characteristic of a notch filter according to one embodiment of the invention.

The transfer function NOC of the notch filter shows an amplitude value A of one for all frequencies f except around a notch frequency $f_N$. Therefore, frequency portions of a signal around the notch frequency $f_N$ are filtered out.

Figure 6:
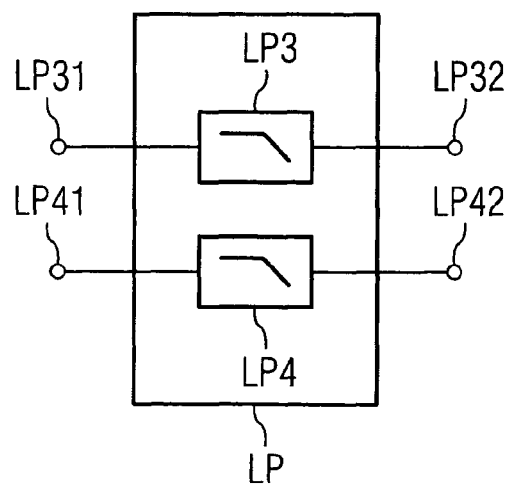
FIG. 6 is an exemplary embodiment of a low-pass filter element.

FIG. 6 shows an exemplary embodiment of a low-pass filter element LP. It comprises a first low-pass filter LP3 coupled between a filter input 31 and a filter output 32 and a second low-pass filter LP4 coupled between a further filter input LP41 and an output LP42. The low-pass filters LP3 and LP4 can have different cut-off frequencies, such that an amplitude component and a phase component are filtered differently. Similar to the notch filters NO1, NO2 of FIG. 4, the low-pass filters LP3, LP4 can be implemented as analog filters or as digital filters. In one embodiment each of the low-pass filters LP3, LP4 can comprise several cascaded low-pass filters which result in a respective desired low-pass filter transfer function.

Figure 7:
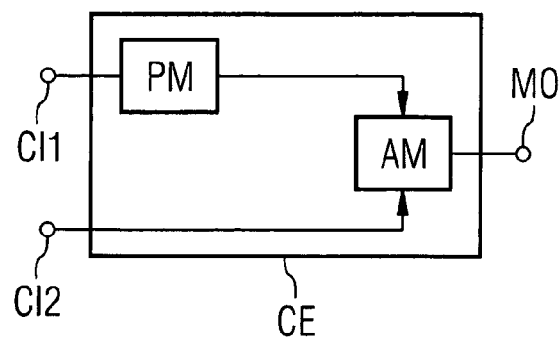
FIG. 7 is an exemplary embodiment of a combination element.

FIG. 7 shows an exemplary embodiment of a combination element CE. It comprises a phase modulator element PM and an amplitude modulator element AM. An input of the phase modulator element is formed by the first combination input CI1 to receive a phase component. The amplitude modulator element AM is coupled as well to an output of the phase modulator element PM as to the second combination input CI2. An output of the amplitude modulator element AM forms the modulator output MO.

The phase modulator element PM generates a phase modulated carrier signal depending on the phase component at its input. For example, in one embodiment the phase modulator element PM comprises a phase-locked loop (PLL) with a modulator input to receive the phase information comprised by the phase component. In this case, the phase-locked loop generates a phase modulated radio frequency signal which is provided to the amplitude modulator element AM. In the amplitude modulator element AM, an amplitude modulation of the phase modulated radio frequency signal is performed as a function of the amplitude component. To this end, a digital amplitude component is converted to an analog signal and is frequency mixed or frequency multiplied with the radio frequency signal. If the amplitude component is provided as an analog signal, the frequency mixing or frequency multiplying can be performed directly. The amplitude modulated radio frequency signal corresponds to a polar modulated radio frequency signal.

In another embodiment, the amplitude modulator element AM can comprise a power amplifier which is provided with the phase modulated radio frequency signal. An amplitude modulation can be performed by varying a supply voltage or a bias current of the power amplifier as a function of the amplitude component. The output of the power amplifier corresponds to the polar modulated radio frequency signal.

Figure 8:
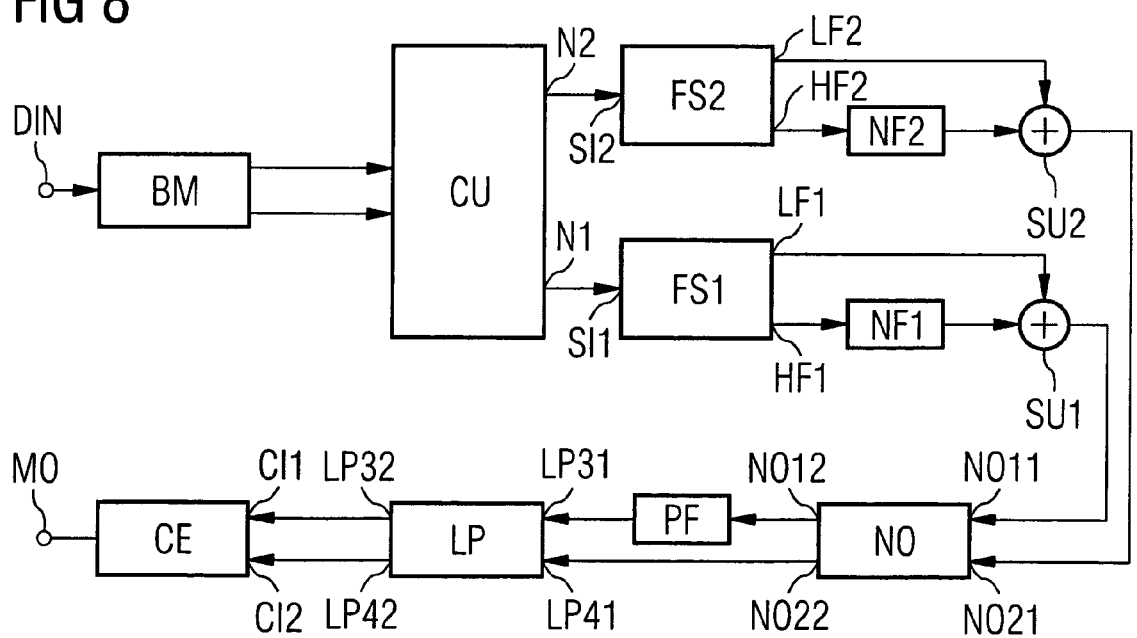
FIG. 8 is a second exemplary embodiment of a polar modulator arrangement.

FIG. 8 shows another embodiment of a polar modulator arrangement. In addition to the embodiment shown in FIG. 1, the polar modulator arrangement comprises a second frequency separation device FS2, a second nonlinear filter device NF2 and a second summation element SU2 whose function corresponds to the function of the first frequency separation device FS1, the first nonlinear filter device NF1 and the first summation element SU1. A signal input SI2 of the second frequency separation device FS2 is coupled to the second node N2. The second frequency separation device FS2 further comprises a second low-frequency output LF2 and a second high-frequency output HF2 which is coupled to the second nonlinear filter device NF2. The second summation element SU2 is on its input side coupled to an output of the second nonlinear filter device NF2 and to the second low-frequency output LF2. An output of the second summation element SU2 is coupled to the second notch filter input NO21.

Accordingly, the second frequency separation device FS2 separates the second component and the second node N2 into a second low-frequency portion at the second low-frequency output LF2 and a second high-frequency portion at the second high-frequency output HF2 depending on a second cut-off frequency. The cut-off frequencies of the first and the second frequency separation device FS1, FS2 can be different.

The second high-frequency portion of the second component is filtered with the second nonlinear filter device NF2 and combined with the second low-frequency portion by the second summation element SU2.

In this embodiment, the first component corresponds to a phase component and the second component corresponds to an amplitude component. In this embodiment, the first notch filter output NO12 is coupled to the first low-pass filter input LP31 via a phase-to-frequency converter PF. The phase-to-frequency converter PF generates a signal corresponding to a phase difference component as a function of the processed phase component. Therefore, the phase difference component is low-pass filtered with the low-pass filter element LP and provided to the combination element CE to generate a phase modulated carrier signal as a function of the phase difference. The phase-to-frequency converter PF can also be omitted in an alternative embodiment of a polar modulator arrangement. The phase-to-frequency converter PF can also be provided before the notch filter element NO or after the low-pass filter element LP. It is also possible to include the phase-to-frequency converter PF in the embodiment shown in FIG. 1.

With the embodiments shown it is further possible to reduce the requirements for an analog radio frequency filter in a transmitter arrangement, wherein spectral requirements for spurious emissions or out-of-band emissions can be fulfilled.

Figure 9:
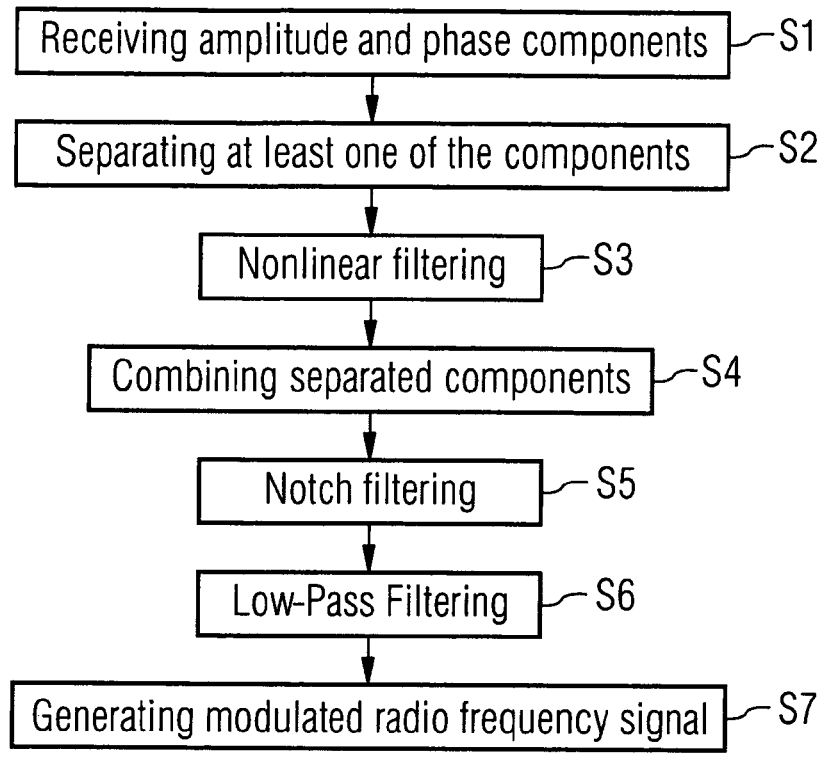
FIG. 9 is an exemplary embodiment of a polar modulation method.

FIG. 9 shows an exemplary embodiment of a polar modulation method. While the method and other methods of the invention are illustrated and described below as a series of acts or events, it will be appreciated that the present invention is not limited by the illustrated ordering of such acts or events. For example, some acts may occur in different orders and/or concurrently with other acts or events apart from those illustrated and/or described herein, in accordance with the invention. In addition, not all illustrated actions may be required to implement a methodology in accordance with the invention.

At S1 a first and a second component corresponding to an amplitude component and a phase component are received. At least one of the components is separated into a low frequency portion and a high frequency portion depending on a respective cut-off frequency at S2. For example, in one embodiment only the first component is separated into a first low-frequency portion and a first high-frequency portion depending on a first cut-off frequency. Additionally, the second component may be separated into a second low-frequency portion and a second high-frequency portion depending on a second cut-off frequency. For example, the low-frequency portion is generated by performing a low-pass filtering of the respective component depending on the respective cut-off frequency and the high-frequency portion is generated by subtracting the low-frequency portion from the respective component.

At S3 the high-frequency portion of a separated component is nonlinearly filtered. Therefore, a nonlinear filtering can be performed for a first high-frequency portion or for both a first and a second high-frequency portion. The nonlinear filtering may be performed according to the embodiment of a nonlinear filter characteristic of a nonlinear filter device as shown in FIG. 3. Therefore, an output of the nonlinear filtering may be dependent on respective threshold values and respective fixed values.

At S4 the respective low-frequency portion and the filtered high-frequency portion of each separated component is combined to a respective processed component.

At S5 a notch filtering is performed for the first processed component and a second component which may be processed or unprocessed. A frequency range used for the notch filtering can be different for the first and the second component.

At S6 the first and the second component are low-pass filtered, wherein the low-pass filtering may be performed for different cut-off frequencies for the first and the second component.

In one embodiment, S5 and S6 may be interchanged, such that a low-pass filtering is performed before a notch filtering. S5 and/or S6 may also be omitted in another embodiment.

At S7 a polar modulated radio frequency signal is generated as a function of the first and the second component. To this end an amplitude modulation of a phase modulated carrier signal can be performed as a function of the first and the second component, wherein the amplitude modulation depends on the amplitude component and the phase modulation of the carrier signal depends on the phase component.

A polar modulator arrangement according to one of the shown embodiments can be used within an UMTS system implementing a transmission standard according to high-speed uplink packet access (HSUPA). In the following figures, exemplary diagrams of signals corresponding to HSUPA signals with square root raised cosine pulse shaping using the proposed principle are shown.

Figure 10:
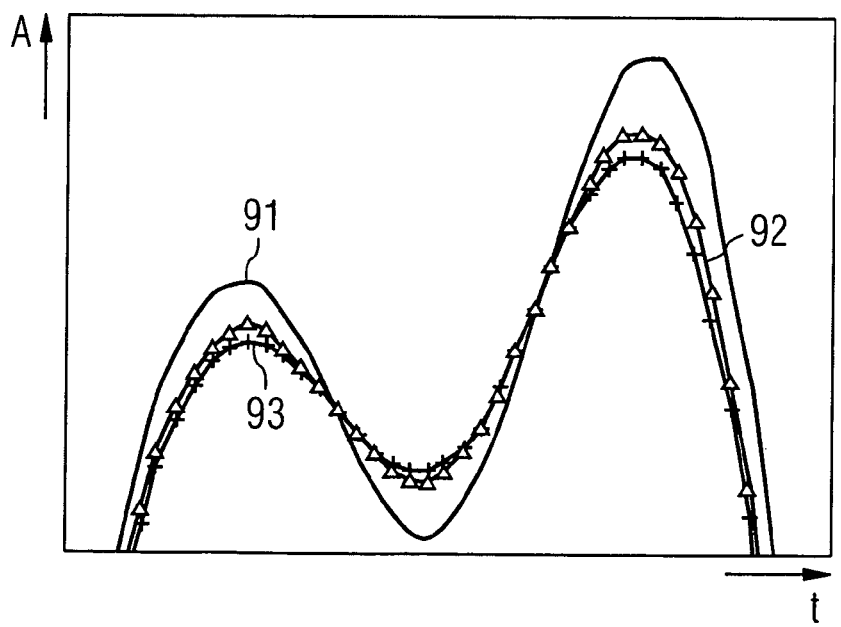
FIG. 10 is an exemplary signal/time diagram of an amplitude component.

FIG. 10 shows an exemplary signal/time diagram of signals corresponding to an amplitude component. For purposes of clarity, only a section of the signals is shown. Signal 91 corresponds to the amplitude component provided by the conversion unit CU. Signal 92, denoted by a triangle symbol, corresponds to the signal 91 filtered with the notch filter element NO. Low-pass filtering of the signal 92 results in a signal 93, denoted by a plus symbol. It can be seen that large changes of the magnitude component 91 are reduced in the filtered signal 93 which is provided to the combination element CE for generating the polar modulated signal.

Figure 11:
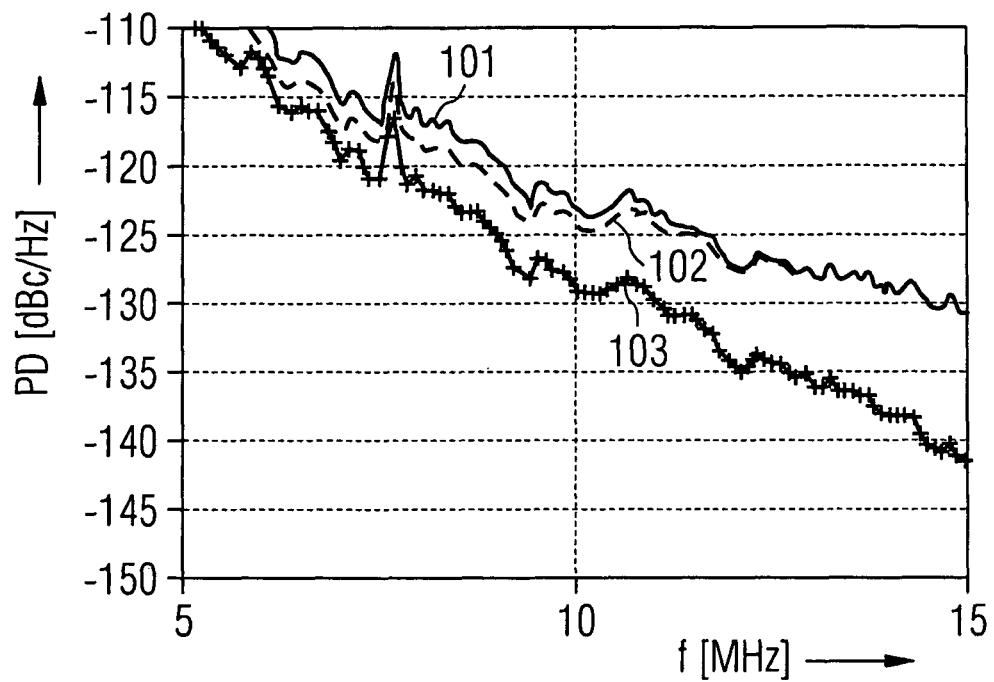
FIG. 11 is an exemplary frequency diagram of an amplitude component.

FIG. 11 shows an exemplary diagram of a power density PD of the signals 91, 92, 93 as a function of the frequency f. In this diagram, the signal 101 corresponds to the power density of the unfiltered amplitude component, the signal 102 corresponds to the power density of the notch filtered amplitude component, and the signal 103 corresponds to the power density of the amplitude component after notch and low-pass filtering. It can be seen that a spectral power of the signal 103 is reduced, especially for higher frequencies and therefore, spurious emissions are reduced.

Figure 12:
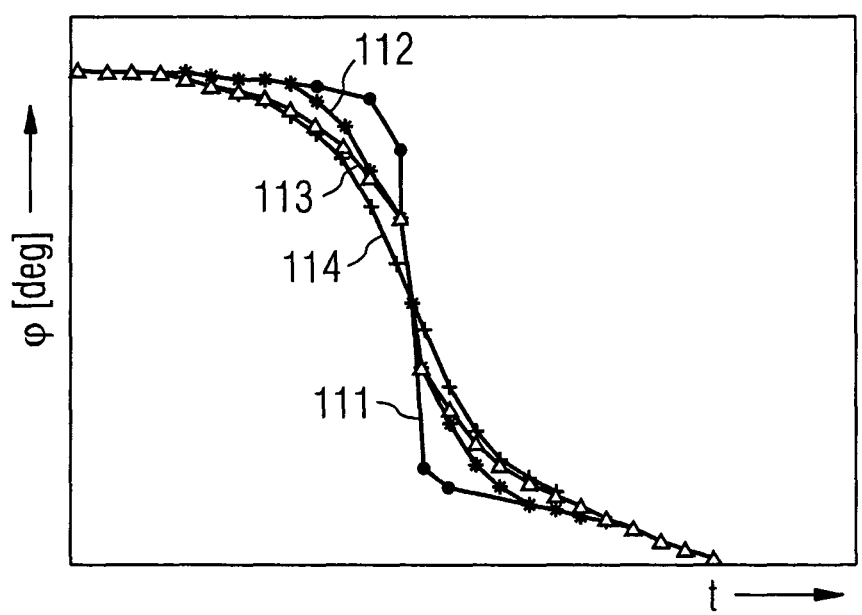
FIG. 12 is an exemplary signal/time diagram of a phase component.

FIG. 12 shows a signal/time diagram for several signals corresponding to a phase component p. In the diagram, signal 111 denotes an unfiltered or unprocessed phase component at an output of a conversion unit showing an abrupt phase change. Signal 112, which is marked by a star symbol, represents the phase component of signal 111 after processing through frequency separation, nonlinear filtering and recombination of low-frequency portion and processed high-frequency portion. Signal 113, marked with a triangle symbol, and signal 114, marked with a plus symbol, represents the processed phase component after notch filtering and low-pass filtering respectively. As can be seen from the plot, the rapid phase changes are removed and the filtered phase component 114 has a smoother trajectory than the original phase trajectory 111.

Figure 13:
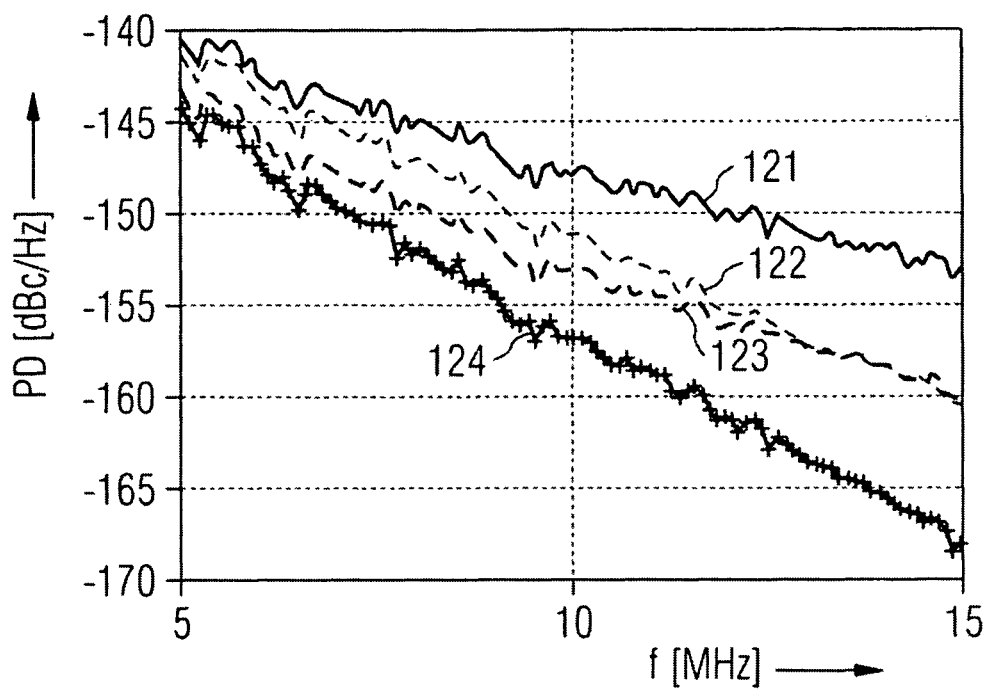
FIG. 13 is an exemplary frequency diagram of a phase component.

FIG. 13 shows an exemplary frequency diagram of signals corresponding to a phase component, represented as a spectral power density PD. In the diagram, signal 121 corresponds to the unprocessed phase component, signal 122 corresponds to the phase component after processing through frequency separation, nonlinear filtering and recombination, signal 123 corresponds to the phase component after notch filtering, and signal 124 corresponds to a final phase component after low-pass filtering. For example, signal 124 represents the phase component which is provided to a combination element CE for generating a polar modulated radio frequency signal. It can be also seen from this plot that the filtered phase component 124 exhibits less bandwidth compared to the original phase component 121. This fact further contributes to the reduction of the spurious emission of the polar modulated signal.

Figure 14:
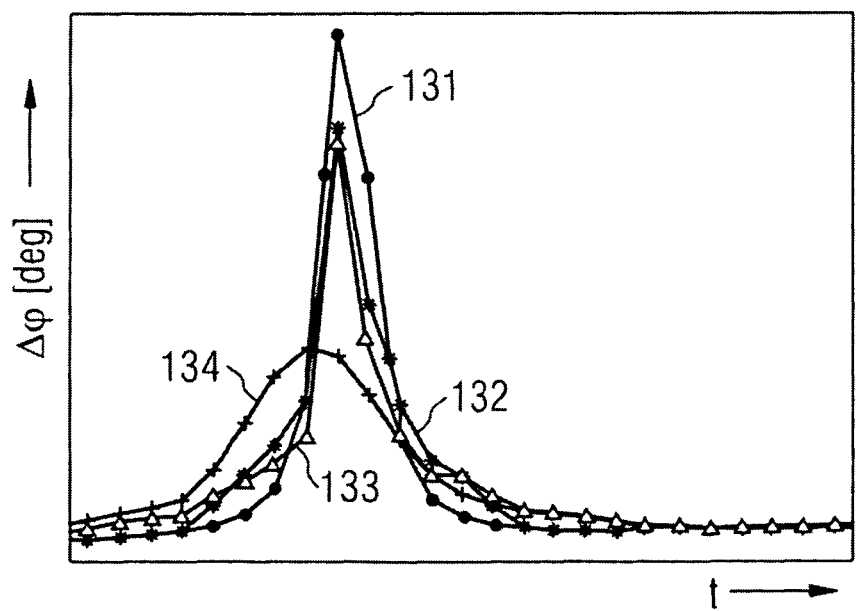
FIG. 14 is an exemplary signal/time diagram for a phase change of a phase component.

FIG. 14 shows an exemplary signal/time diagram for a phase change Δφ of several signals corresponding to a phase component. A phase change of the original phase component at an output of a conversion unit CU is represented by signal 131 which shows a high peak value corresponding to an abrupt phase change. Signal 132, marked with a star symbol, represents a phase change of a phase component after processing through frequency separation, nonlinear filtering and recombination, similar to corresponding signals 112 and 122. A phase change of the phase component after notch filtering is represented by signal 133, which is marked by a triangle symbol. In the signals 132 and 133, the high peak of signal 131 is reduced. Signal 134, which is marked by a plus symbol, represents a phase change of the phase component after a low-pass filtering, for example with a low-pass filter element LO. It can be seen that the abrupt phase change is further reduced within signal 134 and therefore, spurious emissions in the polar modulated signal can be reduced.

Figure 15:
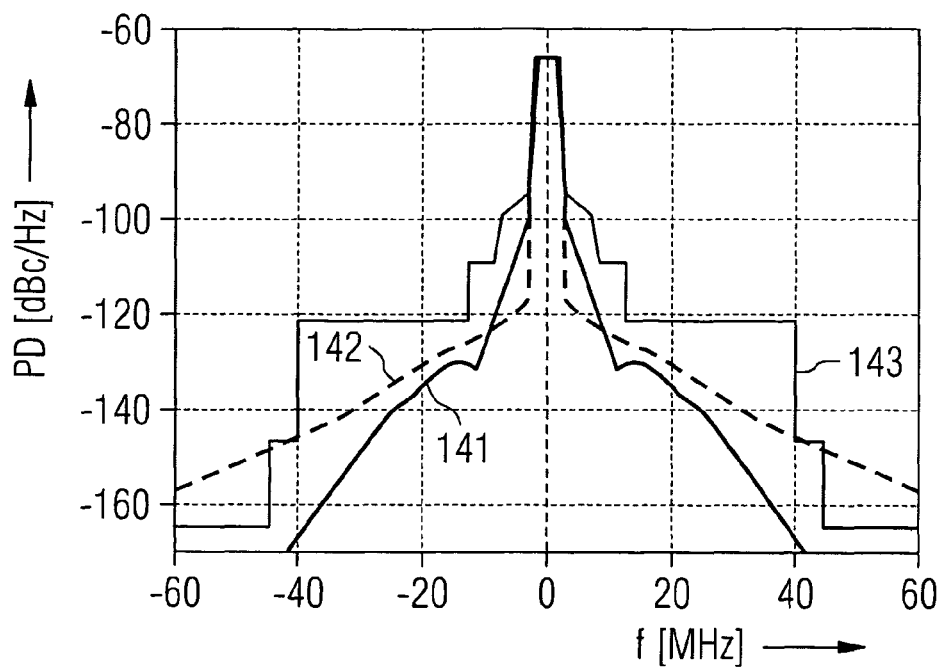
FIG. 15 is an exemplary spectral power density diagram.

FIG. 15 shows an exemplary spectral power density diagram of a polar modulated signal at the modulator output MO. Line 143 represents a spectral mask which, for example, is provided as a requirement for a mobile radio standard like UMTS. To fulfill the requirements given by the mobile radio standard, a power density of a modulated radio frequency signal should be below the limits given by the spectral mask 143. Curve 141 represents the power density of a polar modulated radio frequency signal according to one embodiment of the invention. It can be seen that the spectral requirements for spurious emissions and out-of-band emissions given by the spectral mask 143 are easily met. The curve 142 represents the spectral power density of a polar modulated signal, wherein only a simple low-pass filtering of the amplitude and the phase component has been performed. It can be seen that the curve 142 does not meet the requirements of the spectral mask 143 for all frequency ranges. Especially in the range of above 45 MHz and below −45 MHz, the curve 142 shows spectral emissions above the given limits which impairs the signal quality of the modulated radio frequency signal. Thus, an analog radio frequency filter like a SAW filter has to be implemented in a conventional polar transmitter arrangement to meet the given requirements.

The embodiments of the proposed invention show an effective filtering for the amplitude and phase components of a signal to be modulated. A polar modulated radio frequency signal can be provided with good quality both of out-of-band emission and low-level spurious emission, eliminating the need for a radio frequency filter, like a SAW filter. The proposed-principle can easily be implemented with digital filters and digital signal processing, for example in a digital signal processor, in an ASIC or in an FPGA. It is also possible to perform some of the proposed methods or embodiments in the analog domain.

Although specific embodiments have been illustrated and described herein, it will be appreciated by those of ordinary skill in the art, that any arrangement which is calculated to achieve the same purpose may be substituted for the specific embodiments shown. It is to be understood, that the above description is intended to be illustrative and not restrictive. This application is intended to cover any adaptations or variations of the invention. Combinations of the above embodiments and many other embodiments will be apparent to those of skill in the art upon reading and understanding the above description. The scope of the invention includes any other embodiments and applications in which the above structures and methods may be used. The scope of the invention should, therefore, be determined with reference to the appended claims along with the scope of equivalents to which such claims are entitled.

It is emphasized that the Abstract is provided to comply with 37 C.F.R. section 1.72(b) requiring an abstract that will allow the reader to quickly ascertain the nature and gist of the technical disclosure. It is submitted with the understanding, that it will not be used to interpret or limit the scope or meaning of the claims.

The invention claimed is:

1. A polar modulator arrangement, comprising:
a first and a second node configured to receive a signal comprising a first and a second component corresponding to an amplitude component and a phase, respectively;
a first frequency separation device configured to separate the first component into a first low-frequency portion and a first high-frequency portion depending on a first cut-off frequency;
a first nonlinear filter device configured to filter the first high-frequency portion to a filtered first high frequency portion, wherein the filtered first high-frequency portion corresponds to the first high-frequency portion if a value of the first high-frequency portion is less than a first threshold value, and wherein the filtered first high-frequency portion corresponds to a scaled version of the first high-frequency portion of the value if the first high-frequency portion is greater than the first threshold value and less than a second threshold value;
a first summation element configured to combine the filtered first high-frequency portion and the first low-frequency portion to form a first processed component; and
a combination element configured to generate a polar modulated radio frequency signal as a function of the first processed component and the second component; and
comprising at least one of the following two elements:
a notch filter element configured to perform a notch filtering of the first processed component and the second component prior to submission to the combination element, or
a low-pass filter element configured to perform a low-pass filtering of the first processed component and the second component, wherein the low-pass filter element comprises filters configured to perform low-pass filtering at different cut-off frequencies for the first and the second component.

2. The arrangement-of claim 1, further comprising:
a second frequency separation device configured to separate the second component into a second low-frequency portion and a second high-frequency portion depending on a second cut-off frequency;

a second nonlinear filter device configured to filter the second high-frequency portion; and a second summation element configured to combine the filtered second high-frequency portion and the second low-frequency portion to form a second processed component;

wherein the combination element is configured to generate the polar modulated radio frequency signal as a function of the first processed component and the second processed component.

3. The arrangement of claim 1, wherein the first frequency separation device comprises a first low-pass filter comprising the first cut-off frequency configured to generate the first low-frequency portion and a difference element configured to generate the first high-frequency portion as a function of the first component and the first low-frequency portion.

4. The arrangement of claim 1, wherein the combination element is configured to generate the polar modulated radio frequency signal by performing an amplitude modulation of a phase modulated carrier signal as a function of the first and the second component.

5. The arrangement of claim 1, further comprising a conversion unit configured to derive the first and the second component as a function of input data to be modulated.

6. The arrangement of claim 1, wherein the first nonlinear filter device receives a first high-frequency portion on its input side and further outputs a fixed value if an instantaneous value of the first high-frequency portion is greater than the second threshold value.

7. A polar modulator arrangement, comprising:
a first and a second node configured to receive a signal comprising a first and a second component corresponding to an amplitude component and a phase, respectively;
a first frequency separation device configured to separate the first component into a first low-frequency portion and a first high-frequency portion depending on a first cut-off frequency;
a first nonlinear filter device configured to filter the first high-frequency portion;
a first summation element configured to combine the filtered first high-frequency portion and the first low-frequency portion to form a first processed component; and
a combination element configured to generate a polar modulated radio frequency signal as a function of the first processed component and the second component; and
comprising at least one of the following two elements:
a notch filter element configured to perform a notch filtering of the first processed component and the second component prior to submission to the combination element, or
a low-pass filter element configured to perform a low-pass filtering of the first processed component and the second component, wherein the low-pass filter element comprises filters configured to perform low-pass filtering at different cut-off frequencies for the first and the second component;
wherein the notch filter element comprises notch filters configured to perform notch filtering at different frequency ranges for the first and the second component.

8. A polar modulator arrangement, comprising:
a first and a second node configured to receive a signal comprising an amplitude component and a phase component;

a first frequency separation device comprising a first input coupled to the first node, and comprising a first low-frequency output and a first high-frequency output, and configured to provide frequency separated portions of a signal supplied at the first input depending on a first cut-off frequency at the first low-frequency output and the first high-frequency output, respectively;
a first nonlinear filter device coupled to the first high-frequency output;
a first summation element which on its input side is coupled to an output of the first nonlinear filter device and to the first low-frequency output; and
a combination element comprising a first combination input coupled to an output of the first summation element and a second combination input coupled to the second node, wherein the combination element is configured to generate a polar modulated radio frequency signal as a function of signals at its first and second combination input;
wherein the first and the second combination inputs are coupled to the output of the first summation element and to the second node by a low-pass filter element configured to perform respective low-pass filtering of signals provided thereto prior to submission to the combination element; and
wherein the low-pass filter element comprises filters configured to perform low-pass filtering at different cut-off frequencies.

9. The arrangement of claim 8, further comprising:
a second frequency separation device comprising a second input coupled to the second node, and comprising a second low-frequency output and a second high-frequency output, and configured to provide frequency separated portions of a signal at the second input depending on a second cut-off frequency at the second low-frequency output and the second high-frequency output, respectively;
a second nonlinear filter device coupled to the second high-frequency output;
a second summation element which on its input side is coupled to an output of the second nonlinear filter device and to the second low-frequency output; and
wherein the second combination input of the combination element is coupled to an output of the second summation element.

10. The arrangement of claim 8, wherein the first and the second combination inputs are coupled to the output of the first summation element and to the second node by a notch filter element configured to perform respective notch filtering of signals provided thereto prior to submission to the combination element.

11. The arrangement of claim 10, wherein the notch filter element comprises notch filters configured to perform notch filtering at different frequency ranges.

12. The arrangement of claim 8, wherein the first frequency separation device comprises a first low-pass filter coupled between the first signal input and the first low-frequency output, and a difference element which on its input side is coupled to the first signal input and the first low-frequency output and on its output side is coupled to the first high-frequency output.

13. The arrangement of claim 8, wherein the first nonlinear filter device receives a first high-frequency portion on its input side and outputs
the first high-frequency portion if an instantaneous value of the first high-frequency portion is less than a first threshold value;

the first high-frequency portion scaled as a function of a predetermined scaling factor if the instantaneous value of the first high-frequency portion is greater than the first threshold value and less than a second threshold value; or a fixed value if the instantaneous value of the first high-frequency portion is greater than the second threshold value.

14. The arrangement of claim 8, wherein the combination element comprises a phase modulator element and an amplitude modulator element which are coupled to the first and the second combination inputs, respectively, and wherein an input of the amplitude modulator element is further coupled to an output of the phase modulator element and the polar modulated radio frequency signal is provided at an output of the amplitude modulator element.

15. The arrangement of claim 8, further comprising a conversion unit, coupled on its input side to a data input and on its output side to the first and the second node, wherein the conversion unit is configured to derive the amplitude component and the phase component as a function of input data provided at the data input.

16. A polar modulation method, comprising:
receiving a first and a second component corresponding to an amplitude component and a phase component, respectively;
separating the first component into a first low-frequency portion and a first high-frequency portion based on a first cut-off frequency;
nonlinear filtering of the first high-frequency portion;
combining the filtered first high-frequency portion and the first low-frequency portion to form a first processed component; and
generating a polar modulated radio frequency signal as a function of the first processed component and the second component;
wherein the nonlinear filtering of the first high-frequency portion comprises outputting at least one of the following:
the first high-frequency portion if an instantaneous value of the first high-frequency portion is less than a first threshold value;
the first high-frequency portion scaled as a function of a predetermined scaling factor if the instantaneous value of the first high-frequency portion is greater than the first threshold value and less than a second threshold value; or
a fixed value if the instantaneous value of the first high-frequency portion is greater than the second threshold value.

17. The method of claim 16, further comprising:
separating the second component into a second low-frequency portion and a second high-frequency portion based on a second cut-off frequency;
nonlinear filtering of the second high-frequency portion; and
combining the filtered second high-frequency portion and the second low-frequency portion to form a second processed component,
wherein the polar modulated radio frequency signal is generated as a function of the first processed component and the second processed component.

18. The method of claim 16, further comprising notch filtering the first processed component and the second component prior to generating the polar modulated radio frequency signal.

19. The method of claim 18, wherein the notch filtering is performed at different frequency ranges for the first and the second component.

20. The method of claim 16, further comprising low-pass filtering the first processed component and the second component prior to generating the polar modulated radio frequency signal.

21. The method of claim 20, wherein the low-pass filtering is performed at different cut-off frequencies for the first and the second component.

22. The method of claim 16, wherein the first low-frequency portion is generated by performing a low-pass filtering of the first component and the first high-frequency portion is generated by subtracting the first low-frequency portion from the first component.

23. The method of claim 16, wherein the polar modulated radio frequency signal is generated by performing an amplitude modulation of a phase modulated carrier signal as a function of the first and the second component.

24. The method of claim 16, wherein the first and the second component are derived as a function of input data to be modulated.

25. A filter arrangement, comprising:
a frequency separation device comprising a signal input, a low-frequency output, and a high-frequency output, and configured to provide frequency separated portions of a signal at the signal input based on a cut-off frequency;
a nonlinear filter device coupled to the high-frequency output, wherein the nonlinear filter device is configured to receive a high-frequency portion from the high-frequency output of the frequency separation device and output a fixed value if a value of the high-frequency portion is greater than a threshold value, and output a scaled version of the high-frequency portion if the value of the high-frequency portion is less than the threshold value;
a summation element which on its input side is coupled to an output of the nonlinear filter device and to the low-frequency output, and configured to provide a summed result at an output thereof; and
a notch filter element configured to receive the summed result at the output of the summation element and provide a filtered summed result at an output thereof.

26. The arrangement of claim 25, further comprising a low-pass filter element configured to receive the filtered summed result and provide a further filtered summed result at an output thereof.

27. The arrangement of claim 25, wherein the frequency separation device comprises a low-pass filter coupled between the signal input and the low-frequency output, and a difference element which on its input side is coupled to the signal input and the low-frequency output, and on its output side is coupled to the high-frequency output.

28. The arrangement of claim 25, wherein, the value of the high frequency portion comprises a frequency value.

29. A filter arrangement, comprising:
a frequency separation device comprising a signal input, a low-frequency output, and a high-frequency output, and configured to provide frequency separated portions of a signal at the signal input based on a cut-off frequency;
a nonlinear filter device coupled to the high-frequency output;
a summation element which on its input side is coupled to an output of the nonlinear filter device and to the low-frequency output, and configured to provide a summed result at an output thereof;

a notch filter element configured to receive the summed result at the output of the summation element and provide a filtered summed result at an output thereof; and wherein the nonlinear filter device receives a high-frequency portion on its input side, and outputs:
- the high-frequency portion if an instantaneous value of the high-frequency portion is less than a first threshold value;
- the high-frequency portion scaled as a function of a predetermined scaling factor if the instantaneous value of the high-frequency portion is greater than the first threshold value and less than a second threshold value; or
- a fixed value if the instantaneous value of the high-frequency portion is greater than the second threshold value.

30. A filtering method, comprising:
separating an input signal into a low-frequency portion and a high-frequency portion based on a cut-off frequency;
nonlinear filtering the high-frequency portion by outputting a fixed value if a value of the high-frequency portion is greater than a threshold value, and outputting a scaled version of the high-frequency portion if the high-frequency portion is less than the threshold value; and
generating an output signal by combining the filtered high-frequency portion and the low-frequency portion; and then notch filtering the combined filtered high-frequency portion and the low-frequency portion.

31. The method of claim 30, wherein generating the output signal comprises low-pass filtering the combined high and low-frequency portions.

32. The method of claim 30, wherein the low-frequency portion is generated by performing a low-pass filtering of the input signal, and the high-frequency portion is generated by subtracting the low-frequency portion from the input signal.

33. A filtering method, comprising:
separating an input signal into a low-frequency portion and a high-frequency portion based on a cut-off frequency;
nonlinear filtering the high-frequency portion; and
generating an output signal by combining the filtered high-frequency portion and the low-frequency portion; and then notch filtering the combined filtered high-frequency portion and the low-frequency portion; and wherein the nonlinear filtering of the high-frequency portion comprises outputting:
- the high-frequency portion if an instantaneous value of the high-frequency portion is less than a first threshold value;
- the high-frequency portion scaled as a function of a predetermined scaling factor if the instantaneous value of the high-frequency portion is greater than the first threshold value and less than a second threshold value; or
- a fixed value if the instantaneous value of the high-frequency portion is greater than the second threshold value.

34. A polar modulator arrangement, comprising:
a first and a second node configured to receive a signal comprising a first and a second component corresponding to an amplitude component and a phase, respectively;
a first frequency separation device configured to separate the first component into a first low-frequency portion and a first high-frequency portion depending on a first cut-off frequency;
a first nonlinear filter device configured to filter the first high-frequency portion;
a first summation element configured to combine the filtered first high-frequency portion and the first low-frequency portion to form a first processed component; and
a combination element configured to generate a polar modulated radio frequency signal as a function of the first processed component and the second component;
wherein the first nonlinear filter device outputs at least one of the following:
the first high-frequency portion, if an instantaneous value of the first high-frequency portion is less than a first threshold value;
the first high-frequency portion scaled as a function of a predetermined scaling factor, if the instantaneous value of the first high-frequency portion is greater than the first threshold value and less than a second threshold value; or
a fixed value, if the instantaneous value of the first high-frequency portion is greater than the second threshold value.

* * * * *